United States Patent
Choi

[19]

[11] Patent Number: 5,923,586
[45] Date of Patent: Jul. 13, 1999

[54] NONVOLATILE MEMORY WITH LOCKABLE CELLS

[75] Inventor: Byeng-sun Choi, Suwon, Rep. of Korea

[73] Assignee: Samsung Electronics, Co., Ltd., Suwon, Rep. of Korea

[21] Appl. No.: 08/964,521

[22] Filed: Nov. 5, 1997

[51] Int. Cl.[6] ............................................... G11C 7/00
[52] U.S. Cl. ...................... 365/185.09; 365/185.11; 365/185.13; 365/185.23; 365/185.29; 365/218
[58] Field of Search .......................... 365/185.01, 185.09, 365/185.11, 185.13, 185.23, 185.29, 218

[56] References Cited

U.S. PATENT DOCUMENTS 5,274,599  12/1993  Ema ............................................. 365/218
5,513,136  4/1996  Fandrich et al. ...................... 365/185.04
5,737,258  4/1998  Choi et al. ................................. 365/63
5,809,553  9/1998  Choi et al. ................................ 711/170

*Primary Examiner*—Viet Q. Nguyen
*Attorney, Agent, or Firm*—Marger Johnson McCollom, P.C.

[57] ABSTRACT

Disclosed is a nonvolatile memory having lockable cell array. The memory includes a lockable cell array formed of a plurality of lockable cell transistors and lockable word lines coupled to gates of the lockable cell transistors; and a lockable pass transistor array formed of a plurality of lockable pass transistors connecting the lockable word lines to a plurality of selection signals. The lockable word lines are coupled to boosting elements which are in response to capacitive coupling in a bulk during an unlock operation.

3 Claims, 9 Drawing Sheets

NONVOLATILE MEMORY WITH LOCKABLE CELLS

FIELD OF THE INVENTION

The invention is in the field of nonvolatile memories and is more specifically related to nonvolatile memories employing lockable cells which store information about erasure for memory cells.

BACKGROUND OF THE INVENTION

Recently, it has been raised of a need to make, in using memories, even undesirable occurrences of malfunctions due to external noises, power-down, and management by a short-handed user, be impossible to destroy data stored in the memories. In order to provide the safekeeping to the stored data, lockable cells have been proposed in the memories, in which a lockable cell is arranged to correspond to a unit of page (basically referred to a construction of memory cells coupled to a word line) and stores an information of erasure lock or unlock. A foregone technique about the lockable cell, as an example, is disclosed in Korean Application No.94-20426.

FIG. 1 shows a general construction of a memory cell array having lockable cells, in which block selection circuit 1, pass transistor array 2, memory cell array 3, lockable cell array 4 and lockable pass transistor array 5 are arranged. Block selection circuit 1 applies page selection control signal PGATE to pass transistor array 2. Memory cell array 3 is constituted of a plurality of strings in which a plurality of memory cell transistors M1$n$ through M8$n$ are coupled in serial between string selection transistor S1$n$ and ground selection transistor G1$n$. Lockable cell array 4 is a string (or a lockable string) formed of a plurality of lockable cell transistors LM1$n$ through LM8$n$ serially coupled between lockable string selection transistor LS1$n$ and lockable ground selection transistor LG1$n$. Gates of string selection transistors S1$n$ and LS1$n$ are coupled to string selection line SSL in common, and gates of ground selection transistors G1$n$ and LG1$n$ to ground selection line GSL in common. Pass transistor array 2 connects page selection signals S1 through S8 to word lines WL1 through WL8 of memory cell array 3 in response to page selection control signal PGATE. Lockable pass transistor array 5 connects lockable page selection signals LS1 through LS8 to lockable word lines LWL1 through LWL8 in response to PGATE. FIG. 2 shows a section along the word line in FIG. 1, which depicts that a terminal of erasure voltage Vera is connected to the bulk region including pocket P-well 8, N-well 7 and P-substrate 6. FIG. 3 illustrating an equivalent schematic about coupling capacitances involved in the word line by page in the array, where Cp denotes coupling capacitance of the word line at the side of the pass transistor array and Ca is coupling capacitance of the word line at the side of the memory cell array, and Clp and Cla is for the lockable cell array and lockable pass transistor array, will be referred to the following description about an operation of FIG. 1.

In FIG. 4, an erasure unlock operation begins when flag signal SUNLOCK for the unlock mode goes to high level. Responding to SUNLOCK of high level, page selection signals S1~S8 all go to high levels and a lockable page selection signal (one of LS1~LS8) corresponding to a selected cell retains low level while the other lockable page selection signals are pulled up to high levels. String and ground selection signals, SSL and GSL, go to high levels, and page selection control signal PGATE generated from block selection circuit 1 rises up to high level to make transistors SP1, MP1~MP8 and GP1 in pass transistor array 2 be turned on thereby. Then, the voltage of Vcc-Vth (Vcc is power source voltage and Vth is threshold voltage of the pass transistor) is applied to WL1~WL8. A lockable word line corresponding to a selected lockable cell transistor is held on 0 V while other lockable word lines are charged to the Vcc-Vth. In the mean time, erasure voltage Vera over about 20 V is applied to N-well 7 and pocket P-well 8 to charge up therein, as shown in FIG. 2, so that voltage levels of the word lines, Vboost1 for WL1~WL8 and Vboost2 for LWL1~LWL8, increase by capacitive coupling between the bulk region and themselves and arrive at the boosting levels as shown in FIG. 4. Exactly, the Vboost1 is the voltage on the word line in memory cell array 3 and pass transistor array 2, and Vboost2 is the voltage of the lockable word line correspond to the unselected lockable cell and pass transistors, during Vera is being applied thereto. Pass transistors, SP1, MP1~MP8 and GP1, and unselected lockable cell transistors are put into shut-off states. Lockable word lines corresponding to selected lockable cell transistors are held on 0 V. At this point, the Vboost1 and Vboost2 may meet the equations as follows;

$$Vboost1 = Ca/(Ca+Cp) \times (Vera+Vcc-Vth),$$

$$Vboost2 = Cla/(Cla+Clp) \times (Vera+Vcc-Vth).$$

Since the boosted voltages, Vboost1 and Vboost2, respectively on the word lines and unselected lockable word lines cause the corresponding cell transistors, i.e., memory cell transistors and unselected lockable cell transistors, to be situated in the condition to be not erased during the bulk erasure operation, all the cell transistors but the selected lockable cell transistor maintains their data while the selected lockable cell is erased to be changed to an unlock state from a lock state.

However, there would be a failure in the erasure blocking operation against the unselected lockable cell transistors. Referring to the equations for Vboost1 and Vboost2, Vboost2 would be less charged enough to prevent the unselected lockable cell transistors from being erased because Cla is lower than Clp, whereas Ca much larger than Cp in memory cell array can secure the erasure protecting effect against the memory cell transistors.

SUMMARY OF THE INVENTION

Accordingly, it is an object of the invention to provide a nonvolatile memory capable of preventing unselected lockable cell transistors from being erased while selected lockable cell transistors are being erased.

In order to accomplish the object, two preferred embodiments are provided herein.

One aspect of the invention is a nonvolatile memory including a memory cell array formed of a plurality of memory cell transistors and word lines coupled to gates of the memory cell transistors, a pass transistor array formed of a plurality of pass transistors connecting the word lines to a plurality of selection signals, a lockable cell array formed of a plurality of lockable cell transistors and lockable word lines coupled to gates of the lockable cell transistors, and a lockable pass transistor array formed of a plurality of lockable pass transistors connecting the lockable word lines to a plurality of selection signals, wherein the lockable word lines are comprised of boosting elements which are in response to capacitive coupling in a bulk.

Another feature of the invention is a nonvolatile memory comprising, a memory cell array formed of a plurality of memory cell transistors and word lines coupled to gates of the memory cell transistors, a pass transistor array formed of a plurality of pass transistors connecting the word lines to a plurality of selection signals, a lockable cell array formed of a plurality of lockable cell transistors and lockable word lines coupled to gates of the lockable cell transistors, the lockable word lines being coupled to a common lockable word line, and a lockable pass transistor connecting the common lockable word lines to a selection signal, wherein the common lockable word line are comprised of boosting element which are in response to capacitive coupling in a bulk.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF THE PREFERRED EMBODIMENTS

Hereinbelow, applicable embodiments of the invention will be as follows, with the appended drawings.

The First Embodiment

Figure 1:
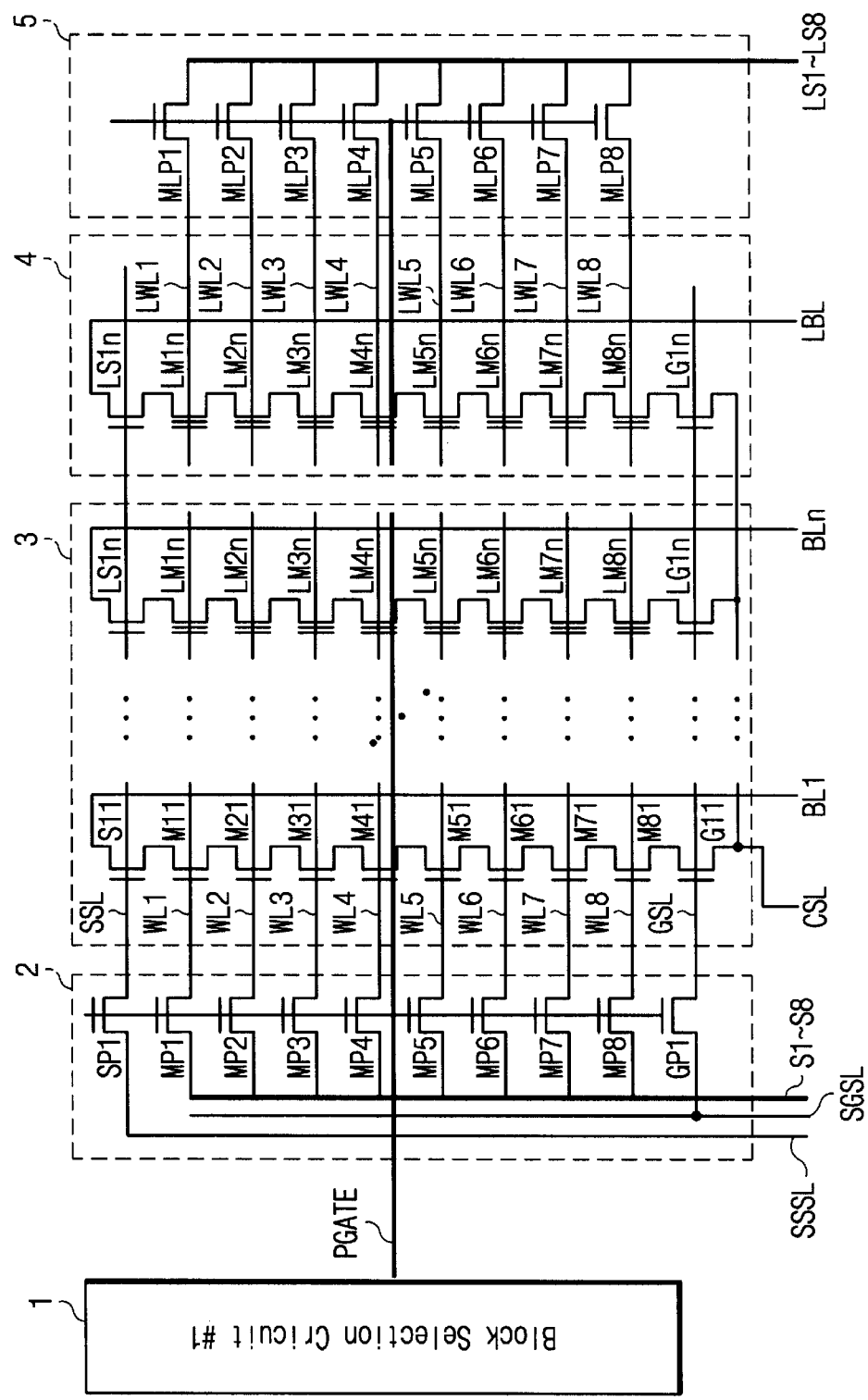
FIG. 1 is a schematic of a construction with memory cells and lockable cells in a conventional memory.
Figure 2:
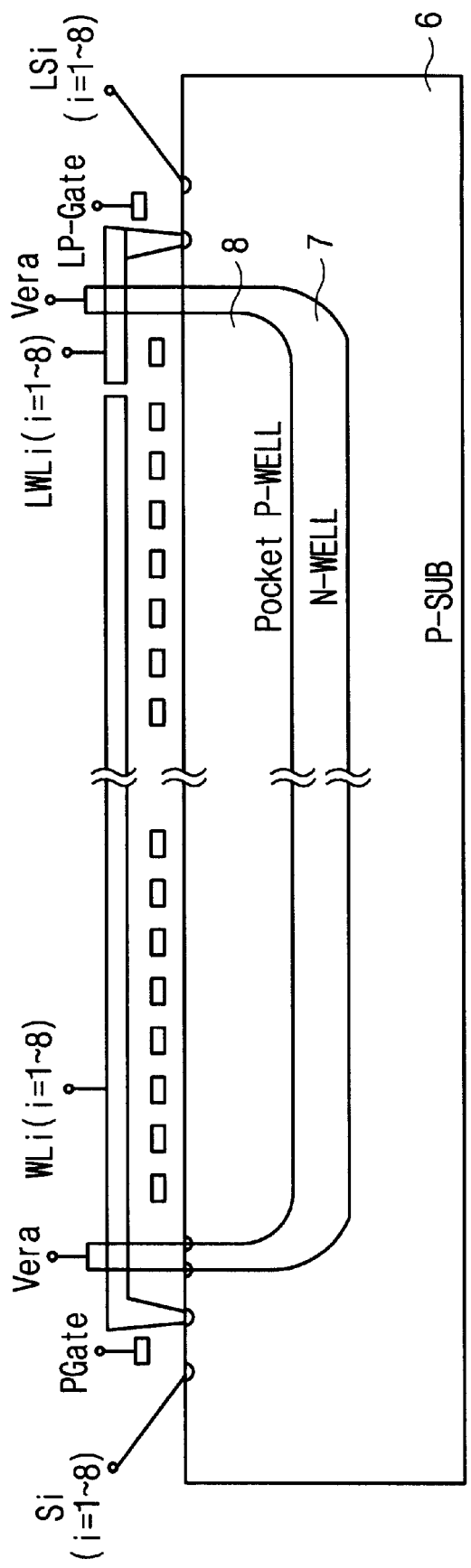
FIG. 2 schematically shows a section along a word line in FIG. 1.
Figure 3:
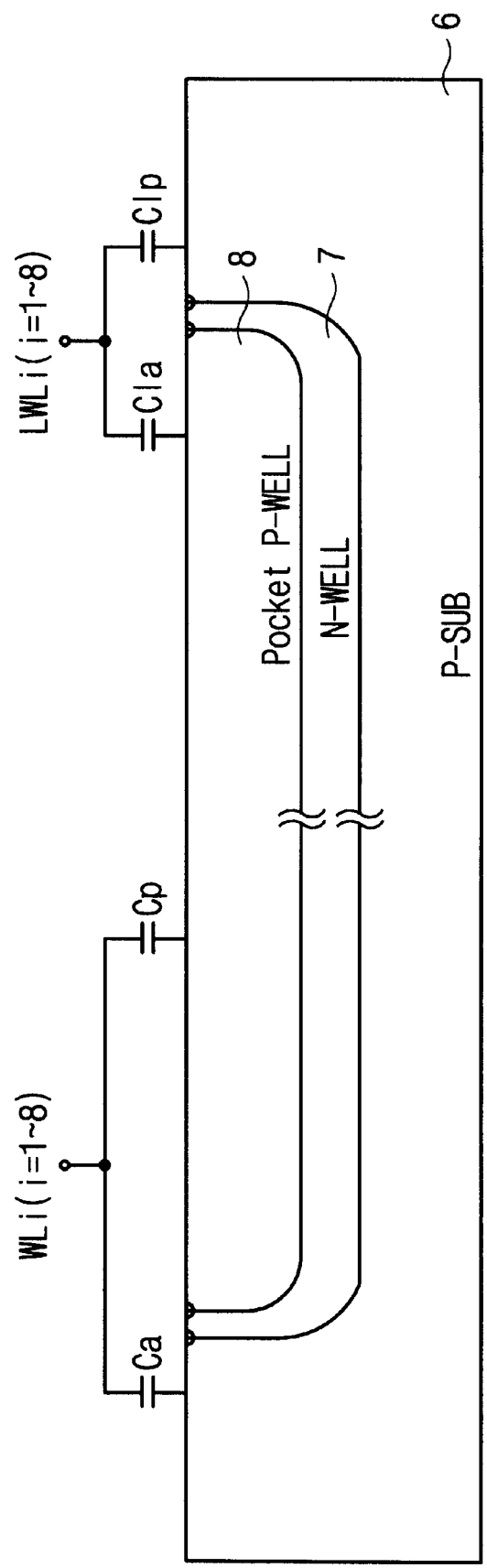
FIG. 3 schematically shows a section considering capacitive configurations around the word line in FIG. 1.
Figure 5:
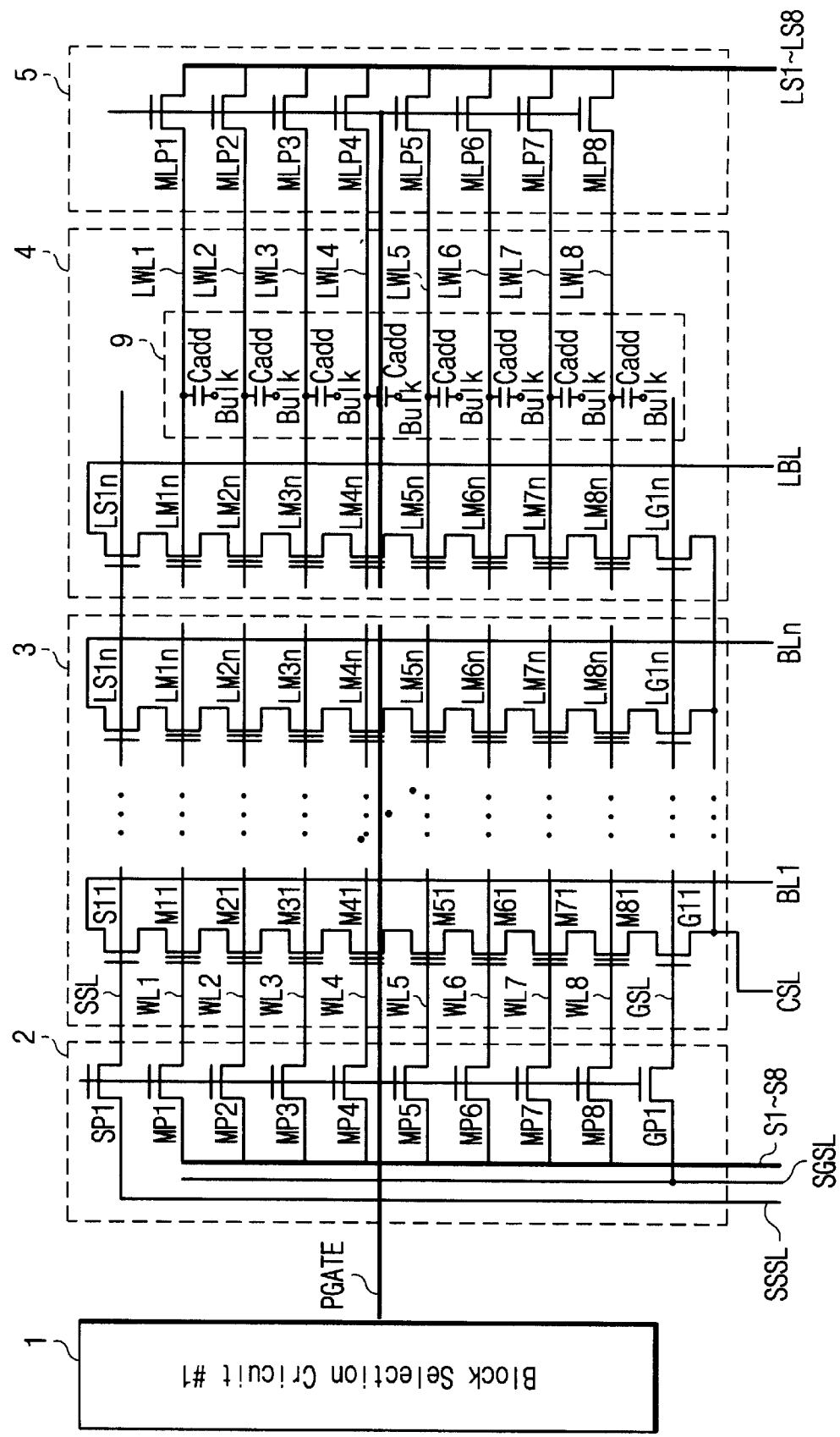
FIG. 5 is a schematic illustrating a construction with memory and lockable cells, according to an embodiment of the invention.
Figure 6:
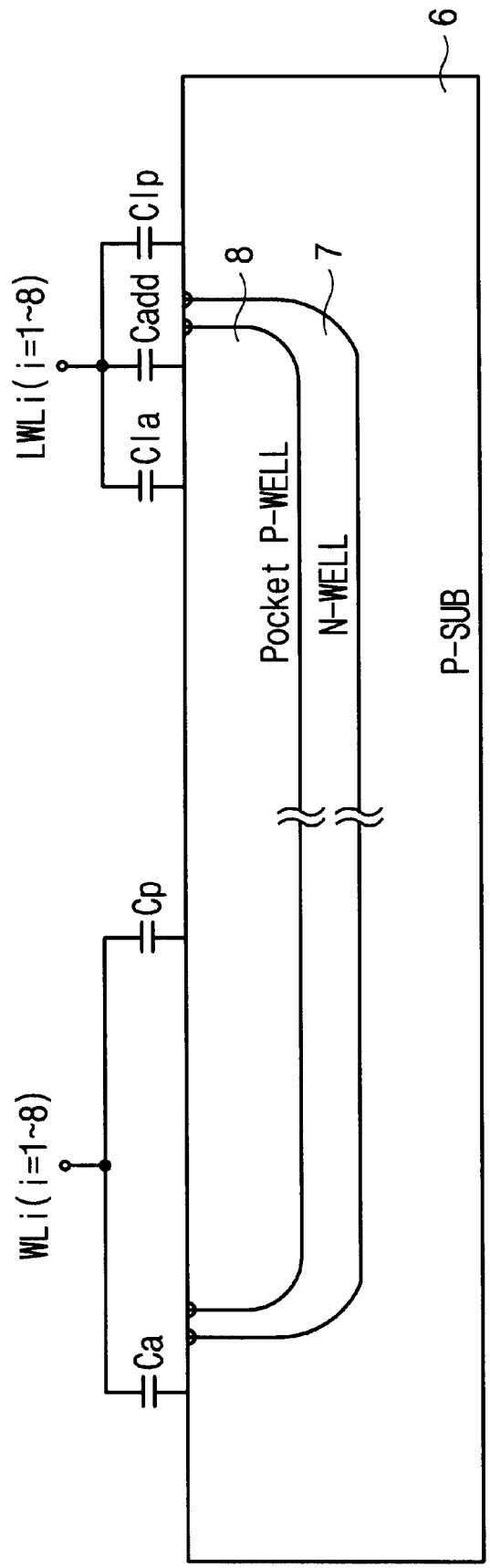
FIG. 6 schematically shows a section along a word line in FIG. 5, considering capacitive configurations around the word line.

Referring to FIG. 5, to each of lockable word lines LWL1~LWL8 in lockable cell array 4, capacitor CADD is provided to enhance the capacitance value of the lockable word line at the side of the lockable cell array and acts as booster 9 therein, in addition to the circuit construction of FIG. 1. The plurality of capacitors CADD are interposed between the lockable word lines and the bulk which includes pocket P-well 8 and N-well 7, as shown in FIG. 6, forming a parallel loop of capacitance together with the Cla and as a result causing the capacitance value on the lockable word line at the side of the lockable memory cell array to be of Cla+CADD when the lockable word line is not selected during an unlock operation in which a selected lockable cell is erased.

Figure 4:
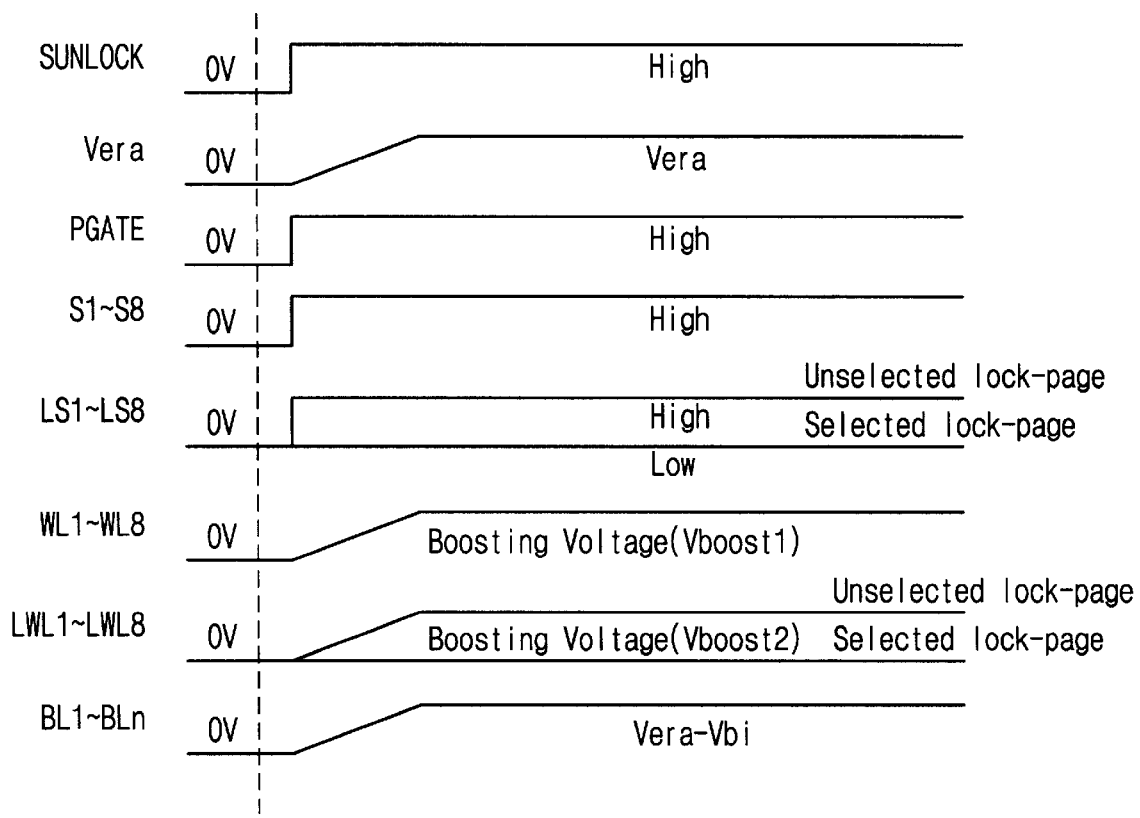
FIG. 4 is a timing diagram corresponding to FIG. 1, during an unlock operation.
Figure 7:
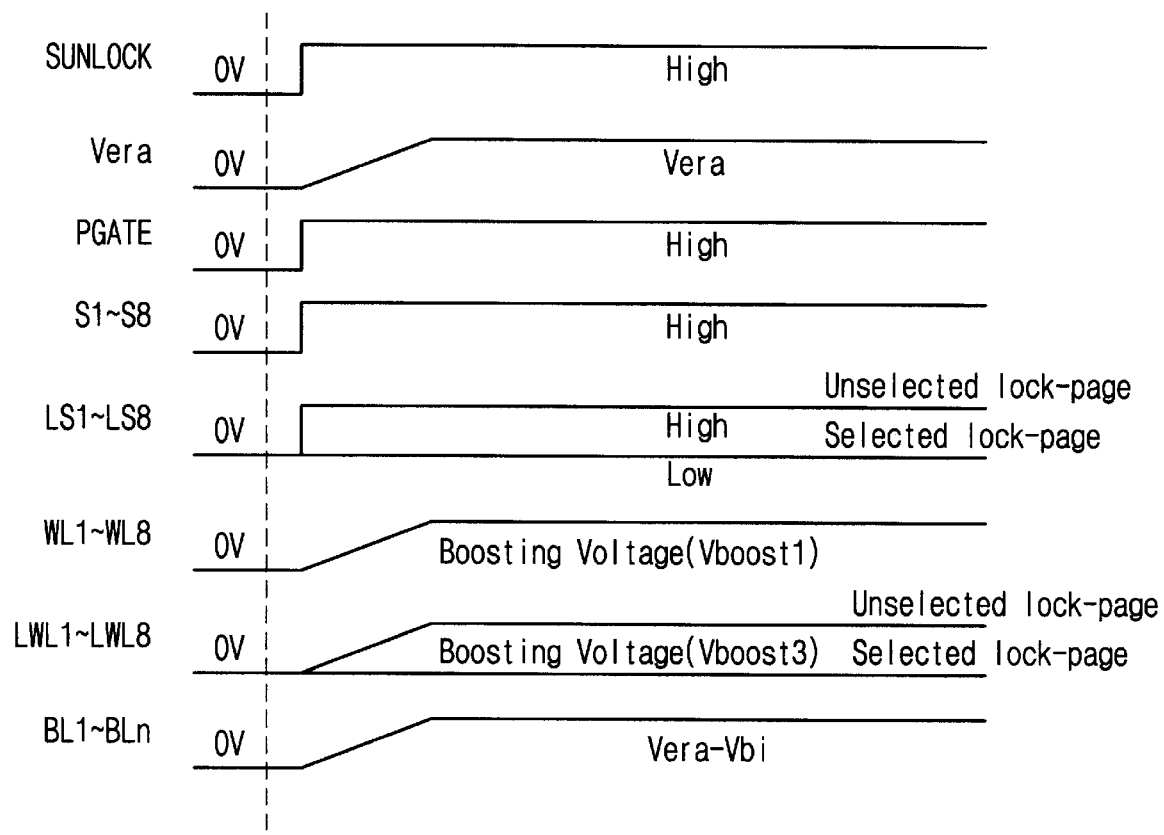
FIG. 7 is a timing diagram corresponding to FIG. 5, during an unlock operation.

Thus, as shown in FIG. 7 that is the same with FIG. 4 but the voltage levels of the unselected lockable word lines, when erasure voltage Vera is being applied to the bulk in order to carry out an unlock operation, unselected lockable word lines are pulled up to boosted level of Vboost3 while word lines in the memory cell array are charged up to the Vboost1. A selected lockable word line is held on 0 V. The Vboost3 can be established by substituting the Cla+CADD for Cla in the equation of the Vboost2. The Vboost3 is (Cla+CADD)/(Cla+CADD+Clp)×(Vera+Vcc−Vth). The incremented voltage level of Vboost3 makes the unselected lockable cell transistors be more hard to lose their data during the bulk erasure is being carried out against a selected lockable cell.

The Second Embodiment

Figure 8:
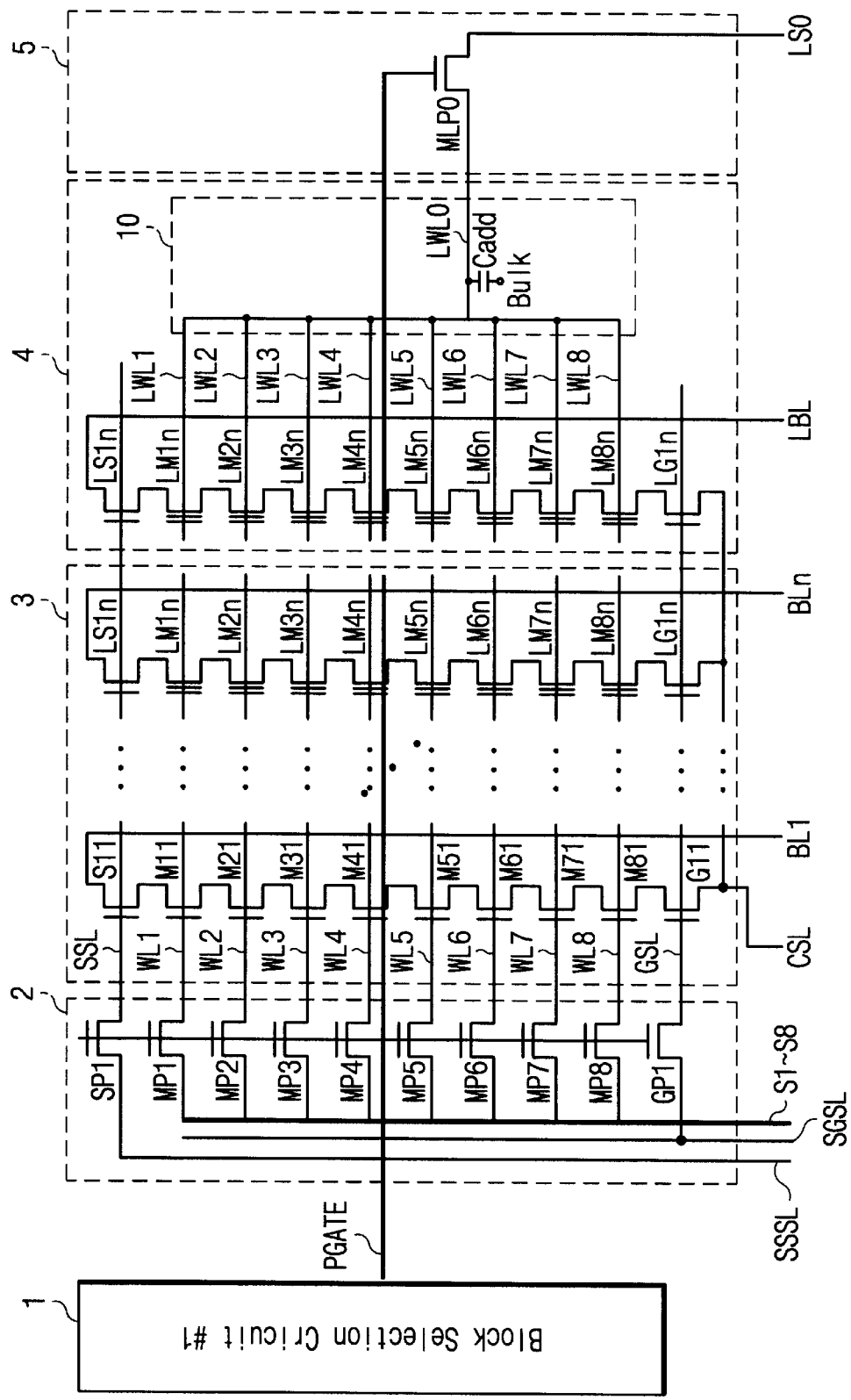
FIG. 8 is a schematic illustrating a construction with memory and lockable cells, according to another embodiment of the invention.

Referring to FIG. 8, all of lockable word lines LWL1~LWL8 are coupled to common lockable word line LWL0 which is formed over the pocket P-well 8 or the N-well 7. And between the common lockable word line LWL0 and the pocket P-well 8 or the N-well 7 of FIG. 6, a capacitor CADD is interposed to act as booster 10 for the lockable word lines. Different from the construction of FIG. 5, the lockable pass transistor array 5 has one lockable pass transistor MLP0 connected between the common lockable word line LWL0 and lockable page selection signal LS0. Gate of lockable pass transistor MLP0 is coupled to page selection control signal PGATE together with gates of the pass transistors for the memory cell array 3.

Figure 9:
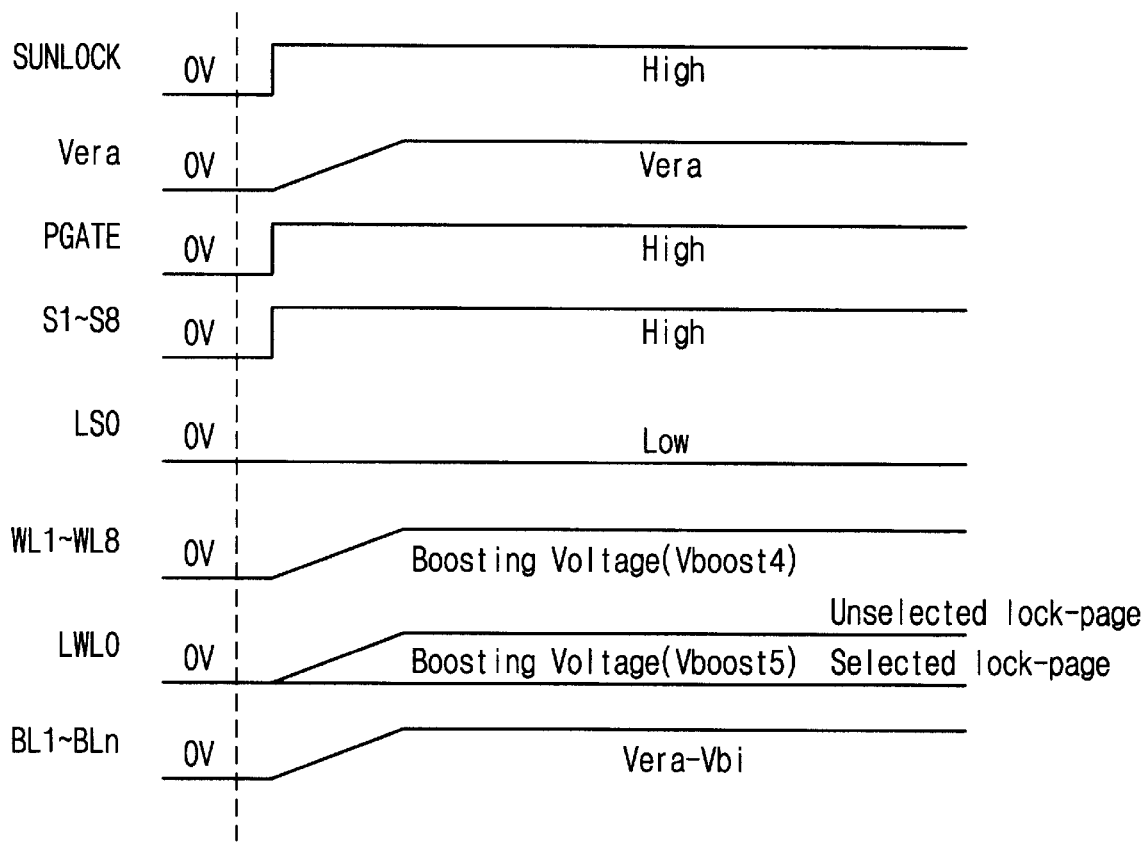
FIG. 9 is a timing diagram corresponding to FIG. 8, during an unlock operation.

In FIG. 9 that is the same with FIG. 4 but the voltage level of the unselected lockable word lines, when erasure voltage Vera is being applied to the bulk in order to carry out the unlock operation, unselected lockable word lines are pulled up to boosted level of Vboost4 while word lines in the memory cell array are charged up to the Vboost1. A selected lockable word line is held on 0 V. The Vboost4 can be designed as follows.

$$Vboost4=(8Cla+CADD)/(8Cla+CADD+Clp)\times(Vera+Vcc-Vth)$$

Also, in this embodiment, the incremented voltage level of Vboost4 makes the unselected lockable cell transistors be more hard to lose their data during the bulk erasure is being carried out against a selected lockable cell.

As described above, the present invention offers significant advantages of preventing unselected lockable cell transistors from being erased while an unlock operation is being carried out against a selected lockable cell transistor.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A nonvolatile memory comprising:
   a memory cell array formed of a plurality of memory cell transistors and word lines coupled to gates of the memory cell transistors;
   a pass transistor array formed of a plurality of pass transistors connecting the word lines to a plurality of selection signals;
   a lockable cell array formed of a plurality of lockable cell transistors and lockable word lines coupled to gates of the lockable cell transistors;
   a lockable pass transistor array formed of a plurality of lockable pass transistors connecting the lockable word lines to a plurality of selection signals; and a plurality of boosting elements, wherein each one of the pluralities of boosting elements is capacitively coupled between a corresponding one of the lockable word lines.

2. A nonvolatile memory comprising:

a memory cell array formed of a plurality of memory cell transistors and word lines coupled to gates of the memory cell transistors;

a pass transistor array formed of a plurality of pass transistors connecting the word lines to a plurality of selection signals;

a lockable cell array formed of a plurality of lockable cell transistors and lockable word lines coupled to gates of the lockable cell transistors, the lockable word lines being coupled to a common lockable word line;

a lockable pass transistor connecting the common lockable word lines to a selection signal; and a boosting element capacitively coupled between the common lockable word line and a bulk.

3. A method for preventing an unselected lockable cell transistor from being erased during an unlock operation on a selected lockable cell transistor, the method comprising the steps:

providing a substitute having a first type forming a well in the substitute, this well having a second dopant type;

forming a pocket well in the well, the pocket well having the first dopant type;

forming a pass transistor on the substitute;

forming a memory all transistor on the pocket well, where a gate of the memory cell transistor is coupled to a word line, and the word line being coupled to the pass transistor;

forming a lockable cell transistor on the pocket well, where gate of the lockable all transistor is coupled to a lockable word line;

forming a lockable pass transistor on the substitute, where the lockable word line is coupled to the lockable pass transistor; and coupling a capacitor between the pocket well and the lockable word line.

* * * * *